United States Patent
Ota et al.

(10) Patent No.: US 9,584,168 B2
(45) Date of Patent: Feb. 28, 2017

(54) DISTORTION COMPENSATOR AND DISTORTION COMPENSATION METHOD

(71) Applicant: FUJITSU LIMITED, Kawasaki-shi, Kanagawa (JP)

(72) Inventors: Tomoya Ota, Kawasaki (JP); Kazuo Nagatani, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 15/009,041

(22) Filed: Jan. 28, 2016

(65) Prior Publication Data

US 2016/0269058 A1 Sep. 15, 2016

(30) Foreign Application Priority Data

Mar. 10, 2015 (JP) .................................. 2015-047394

(51) Int. Cl.
*H04B 1/04* (2006.01)

(52) U.S. Cl.
CPC ... *H04B 1/0475* (2013.01); *H04B 2001/0408* (2013.01)

(58) Field of Classification Search
CPC .................. H04B 1/0475; H04B 2001/0408
USPC ................... 375/260, 267, 295, 297
See application file for complete search history.

(56) References Cited

U.S. PATENT DOCUMENTS

| | | | | |
|---|---|---|---|---|
| 7,315,199 B2* | 1/2008 | Oishi | ........................ | H03F 1/08 327/552 |
| 8,948,301 B2* | 2/2015 | Rollins | .................. | H04L 27/368 375/285 |
| 2007/0253566 A1 | 11/2007 | Shako et al. | | |
| 2013/0094612 A1* | 4/2013 | Kim | ...................... | H03F 1/3247 375/297 |
| 2013/0141160 A1 | 6/2013 | Ohkawara et al. | | |
| 2014/0376676 A1* | 12/2014 | Schafferer | ............. | H04L 7/0091 375/356 |

FOREIGN PATENT DOCUMENTS

| | | |
|---|---|---|
| JP | 2007-288492 | 11/2007 |
| JP | 2009-200694 | 9/2009 |
| JP | 2010-258932 | 11/2010 |
| WO | 2012111583 | 8/2012 |

OTHER PUBLICATIONS

Hsin-Hung Chen, et al., "Joint Polynomial and Look-Up-Table Predistortion Power Amplifier Linearization," in IEEE Transactions on Circuits and Systems II: Express Briefs, vol. 53, No. 8, pp. 612-616, Aug. 2006 (5 pages).

* cited by examiner

*Primary Examiner* — Freshteh N Aghdam
(74) *Attorney, Agent, or Firm* — Fujitsu Patent Center

(57) ABSTRACT

A distortion compensator that compensates for nonlinear distortion of an amplifier that amplifies power of a multi-carrier signal includes a first compensation unit that performs first distortion compensation to collectively compensate for first nonlinear distortion that occurs in contact with a carrier frequency of the multicarrier signal, and second nonlinear distortion that occurs at a frequency at a predetermined distance from the carrier frequency, and a second compensation unit that performs second distortion compensation to compensate for only the first nonlinear distortion, of the first nonlinear distortion and the second nonlinear distortion.

8 Claims, 13 Drawing Sheets

DISTORTION COMPENSATOR AND DISTORTION COMPENSATION METHOD

CROSS-REFERENCE TO RELATED APPLICATION

This application is based upon and claims the benefit of priority of the prior Japanese Patent Application No. 2015-047394, filed on Mar. 10, 2015, the entire contents of which are incorporated herein by reference.

FIELD

The embodiments discussed herein are related to distortion compensators and distortion compensation methods.

BACKGROUND

Wireless transmission devices in wireless communication systems are provided with a power amplifier (hereinafter sometimes referred to as a "PA") that amplifies the power of a transmission signal. The wireless transmission devices generally operate the PA in or near the saturation region of the PA to increase the power efficiency of the PA. However, when the PA is operated in or near the saturation region, nonlinear distortion increases. Thus, in order to reduce the nonlinear distortion, that is, in order to improve the Adjacent Channel Leakage Ratio (ACLR), the wireless transmission devices are provided with a distortion compensator that compensates for nonlinear distortion.

One distortion compensation method used in distortion compensators is a "predistortion method." Hereinafter "predistortion" is sometimes referred to as "PD." A distortion compensator using the PD method multiplies in advance a signal before input to a PA by a distortion compensation coefficient having an inverse characteristic of nonlinear distortion of the PA, to increase the linearity of the output of the PA and suppress distortion of the output of the PA. A signal multiplied by a distortion compensation coefficient is sometimes called a "predistortion signal (PD signal)." Therefore, a PD signal is a predistorted signal according to an inverse characteristic of nonlinear distortion of a PA before being input to the PA.

For example, some distortion compensators using the PD method have a "distortion compensation table" in which a plurality of distortion compensation coefficients are stored, and read from the table a distortion compensation coefficient that depends on the amplitude value of a baseband signal input to the distortion compensators, to multiply the baseband signal by it. Hereinafter, distortion compensation performed using a distortion compensation table is sometimes referred to as "look-up table (LUT)-type distortion compensation."

Some distortion compensators using the PD method approximate an inverse characteristic of nonlinear distortion of a PA by a "power series," and perform distortion compensation using the power series. Hereinafter, distortion compensation performed using a power series is sometimes referred to as "series-type distortion compensation." A distortion compensator using the series-type distortion compensation generates a plurality of higher-order signals on a baseband signal input to the distortion compensator, multiplies the higher-order signals by a distortion compensation coefficient prepared for each order, and synthesizes all the signals multiplied by the distortion compensation coefficients to generate a PD signal.

Examples of related-art are described in Japanese Laid-open Patent Publication No. 2007-288492, in Japanese Laid-open Patent Publication No. 2009-200694, in Japanese Laid-open Patent Publication No. 2010-258932, and in International Publication Pamphlet No. WO 2012/111583.

Further, examples of related-art are described in H.-H. Chen, C.-H. Lin, P.-C. Huang, and J.-T. Chen, "Joint Polynomial and Look-Up-Table Predistortion Power Amplifier Linearization," *IEEE Transactions on Circuits and Systems II, Express Briefs*, vol. 53, no. 8, pp. 612-616, August 2006.

FIGS. 1 and 2 are diagrams for explaining a problem. In a case where a baseband signal is a "multicarrier signal" including a plurality of signals of different carrier frequencies, when a PA is operated in a nonlinear region on the multicarrier signal, intermodulation distortion (hereinafter sometimes referred to as "IM"), which is nonlinear distortion, can occur. For example, as illustrated in FIG. 1, when a multicarrier signal including a signal of a carrier frequency f1 and a signal of a carrier frequency f2 is amplified in the nonlinear region, a signal output from the PA can include IM3, IM5, which are IM of third-order, fifth-order, respectively. Hereinafter, the signal of the carrier frequency f1 is sometimes referred to as a "carrier signal 1," and the signal of the carrier frequency f2 as a "carrier signal 2." The IM occurs in contact with both sides of the carrier frequencies f1, f2, and also occurs at frequencies at predetermined distances by "$\Delta f=|f1-f2|$" from the carrier frequencies f1, f2 on the frequency axis as illustrated in FIG. 1. The IM3, IM5 that occurs at the frequencies at the predetermined distances from the carrier frequencies f1, f2 occur symmetrically on the frequency axis when viewed from a center frequency f0 of the multicarrier signal. The center frequency f0 of the multicarrier signal including the carrier signal 1 and the carrier signal 2 is "$f0=(f1+f2)/2$."

The bandwidth of a "digital signal band" illustrated in FIG. 1 is defined according to a sampling rate of a digital baseband signal. A digital signal band normally corresponds to a distortion compensation range in a distortion compensator.

Hereinafter, IM that occurs in contact with carrier frequencies is sometimes referred to as "first IM," and IM that occurs at frequencies at predetermined distances from the carrier frequencies as "second IM."

Since a distortion compensation range spans the entire digital signal band as illustrated in FIG. 1, the distortion compensator compensates for both of the first IM and the second IM collectively. Therefore, the distortion compensator performs uniform distortion compensation on all the IM, using a distortion compensation coefficient that takes into consideration all the IM existing in the digital signal band, that is, an average distortion compensation coefficient for all the IM. Thus, all the IM is averagely and uniformly suppressed, so that the first IM is not suppressed sufficiently, and as illustrated in FIG. 2, the first IM can remain. When the first IM remains, the ACLR is degraded.

SUMMARY

According to an aspect of an embodiment, a distortion compensator that compensates for nonlinear distortion of an amplifier that amplifies power of a multicarrier signal includes a first compensation unit that performs first distortion compensation to collectively compensate for first nonlinear distortion that occurs in contact with a carrier frequency of the multicarrier signal, and second nonlinear distortion that occurs at a frequency at a predetermined distance from the carrier frequency, and a second compensation unit that performs second distortion compensation to compensate for only the first nonlinear distortion, of the first nonlinear distortion and the second nonlinear distortion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
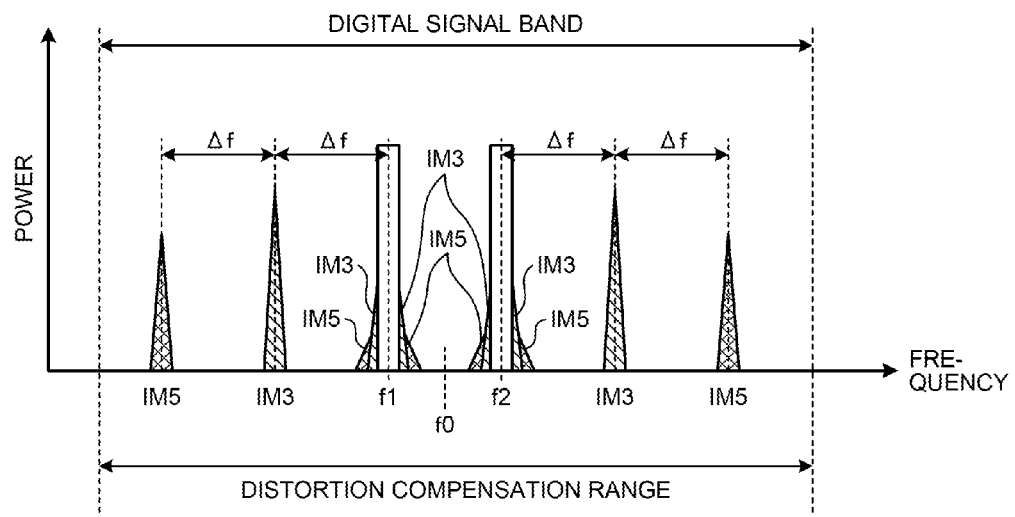
FIG. 1 is a diagram for explaining the problem.
Figure 2:
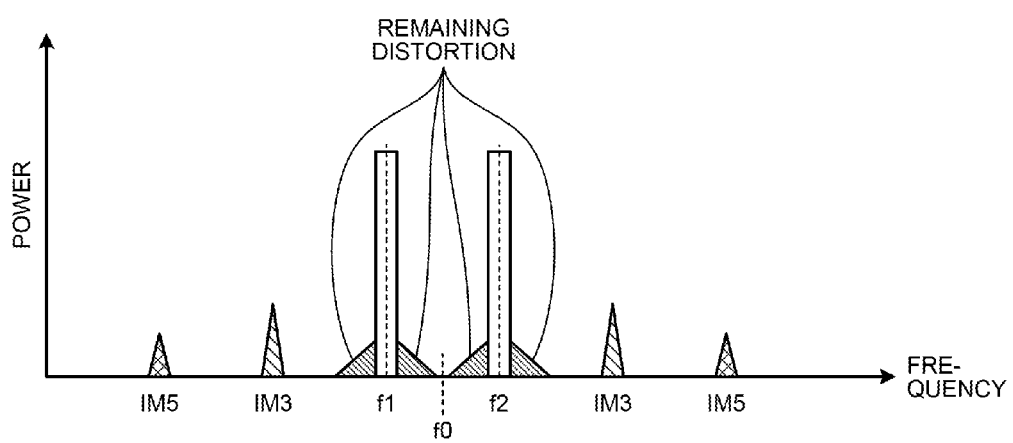
FIG. 2 is a diagram for explaining the problem.

Preferred embodiments of the present invention will be explained with reference to accompanying drawings. The embodiments are not intended to limit the distortion compensator and the distortion compensation method disclosed in the present application. In the embodiments, components having the same functions are denoted by the same reference numerals, and will not be described redundantly.

[a] First Embodiment

Operation Example of Distortion Compensator

Figure 3:
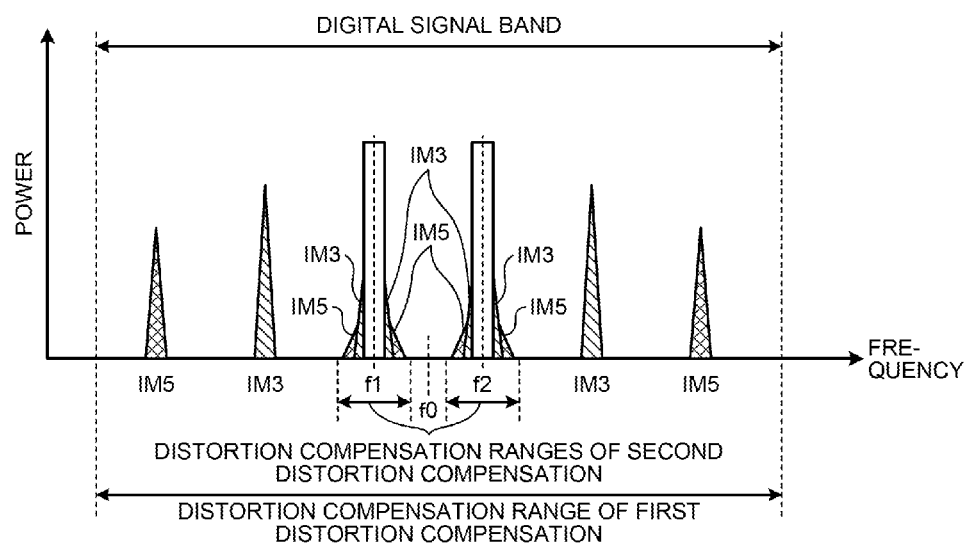
FIG. 3 is a diagram for explaining an operation example of a distortion compensator in a first embodiment.
Figure 4:
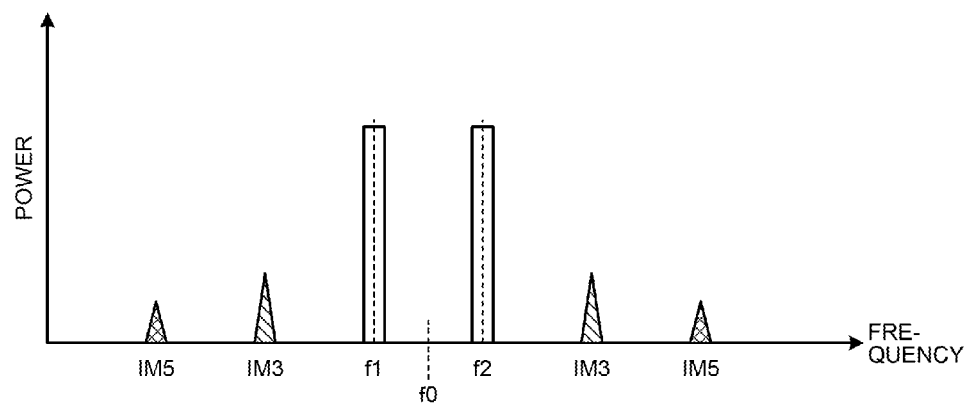
FIG. 4 is a diagram for explaining the operation example of the distortion compensator in the first embodiment.

FIGS. 3 and 4 are diagrams for explaining an operation example of a distortion compensator in a first embodiment.

The distortion compensator compensates for nonlinear distortion of a PA that amplifies the power of a multicarrier signal including a carrier signal 1 and a carrier signal 2.

As illustrated in FIG. 3, the distortion compensator performs "first distortion compensation" that sets an entire digital signal band as a distortion compensation range. Specifically, by the "first distortion compensation," first IM and second IM are compensated for collectively.

Further, as illustrated in FIG. 3, the distortion compensator performs "second distortion compensation" that sets only the vicinities of carrier frequencies f1, f2 as distortion compensation ranges. Specifically, by the "second distortion compensation," of the first IM and the second IM, only the first IM is compensated for. Thus, the "second distortion compensation" specializes in only the first IM to compensate for the first IM independently of the second IM.

Therefore, in the "second distortion compensation," distortion compensation is performed using distortion compensation coefficients specific to the first IM. Thus, according to the first embodiment, distortion compensation performance in the vicinities of the carrier frequencies can be improved, and as illustrated in FIG. 4, the first IM is suppressed sufficiently. Thus, according to the first embodiment, the ACLR can be improved.

Here, in the series-type distortion compensation, by making the order higher, high-precision distortion compensation can be performed, but on the other hand, the circuit size is increased. In other words, in the series-type distortion compensation, by making the order lower, the circuit size is reduced, but on the other hand, the distortion compensation precision is reduced. Therefore, use of the series-type distortion compensation for the "second distortion compensation," in which it is preferable to perform high-precision distortion compensation, results in an increased circuit size. In the series-type distortion compensation, the convergence speed of a distortion compensation coefficient is higher than that in the LUT-type distortion compensation.

On the other hand, the LUT-type distortion compensation can perform high-precision distortion compensation because the order in the series-type distortion compensation can be expressed infinitely, but on the other hand, the convergence speed of a distortion compensation coefficient is lower than that in the series-type distortion compensation. Thus, use of the LUT-type distortion compensation for both of the first distortion compensation and the second distortion compensation results in an excessively lowered convergence speed of distortion compensation coefficients.

Thus, in order to perform the first distortion compensation, and on the other hand, to perform the second distortion compensation with a high degree of precision, with a limited increase in the circuit size, and with the convergence speed prevented from becoming excessively low, it is preferable to use the series-type distortion compensation as the first distortion compensation, and to use the LUT-type distortion compensation as the second distortion compensation.

Configuration Example of Wireless Transmission Device

Figure 5:
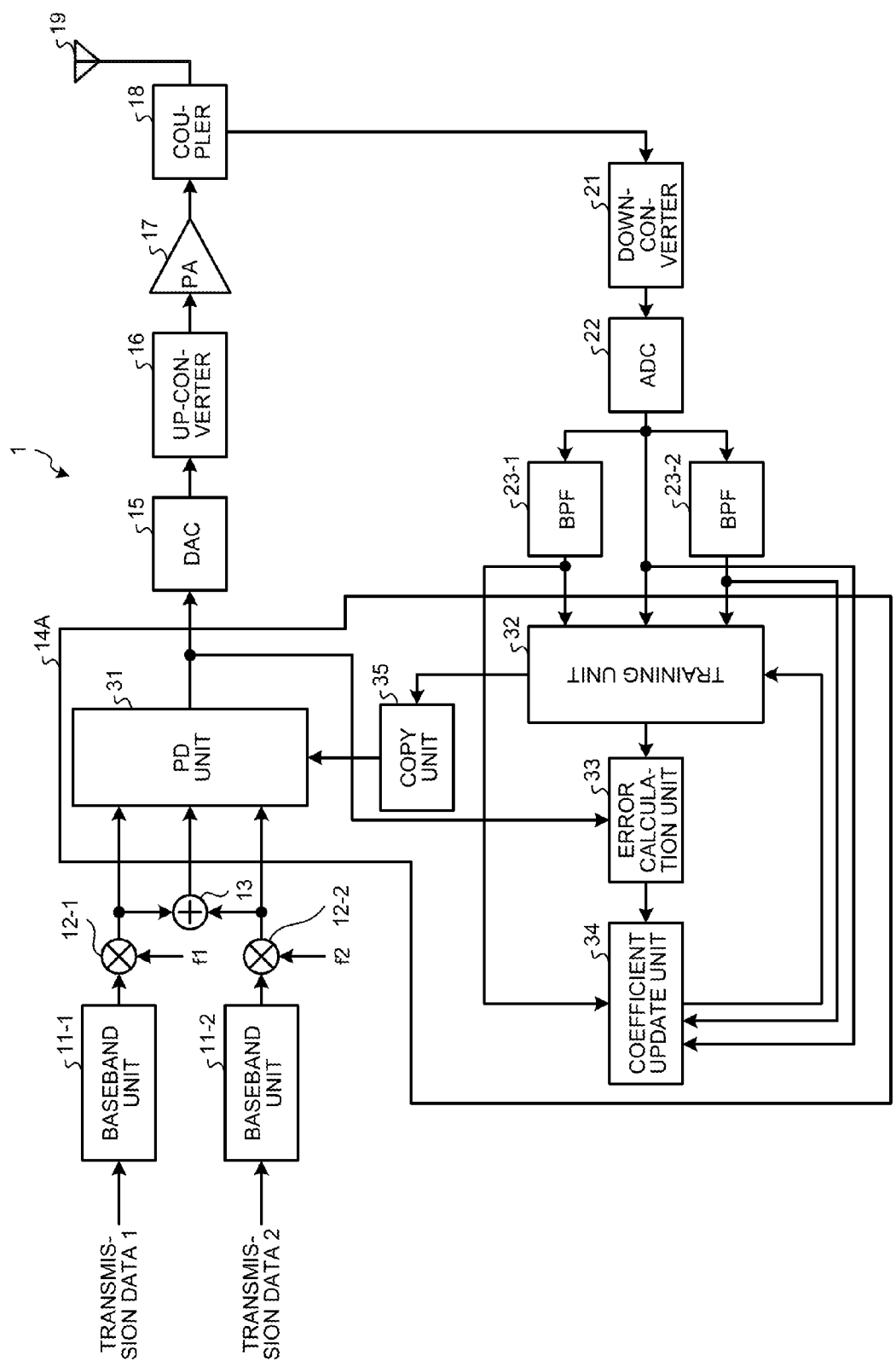
FIG. 5 is a block diagram illustrating a configuration example of a wireless transmission device in the first embodiment.

FIG. 5 is a block diagram illustrating a configuration example of a wireless transmission device in the first embodiment. In FIG. 5, a wireless transmission device 1 has baseband units 11-1, 11-2, multipliers 12-1, 12-2, an adder 13, a distortion compensator 14A, a digital-to-analog converter (DAC) 15, an up-converter 16, a PA 17, a coupler 18, and an antenna 19. The wireless transmission device 1 also has a down-converter 21, an analog-to-digital converter (ADC) 22, and band-pass filters (BPFs) 23-1, 23-2.

The distortion compensator 14A has a PD unit 31, a training unit 32, an error calculation unit 33, a coefficient update unit 34, and a copy unit 35.

The baseband unit 11-1 performs baseband processing such as encoding processing and modulation processing on transmission data 1 input to generate a baseband signal 1, and outputs the generated baseband signal 1 to the multiplier 12-1. The baseband unit 11-2 performs baseband processing such as encoding processing and modulation processing on transmission data 2 input to generate a baseband signal 2, and outputs the generated baseband signal 2 to the multiplier 12-2.

The multiplier 12-1 multiplies the baseband signal 1 by a carrier frequency f1 to generate a carrier signal 1, and outputs the generated carrier signal 1 to the PD unit 31 and the adder 13. The multiplier 12-2 multiplies the baseband signal 2 by a carrier frequency f2 to generate a carrier signal 2, and outputs the generated carrier signal 2 to the PD unit 31 and the adder 13.

The adder 13 adds and synthesizes the carrier signal 1 and the carrier signal 2, and outputs a synthesized signal to the PD unit 31. Therefore, the signal output from the adder 13 is a multicarrier signal including the carrier signal 1 and the carrier signal 2.

The PD unit 31 generates a PD signal based on the carrier signal 1 input from the multiplier 12-1, the carrier signal 2 input from the multiplier 12-2, and the multicarrier signal input from the adder 13, and outputs the generated PD signal to the DAC 15 and the error calculation unit 33. Details of the PD unit 31 will be described below.

The DAC 15 converts the PD signal from a digital signal to an analog signal and outputs it to the up-converter 16.

The up-converter 16 up-converts the analog PD signal, and outputs the up-converted PD signal to the PA 17.

The PA 17 amplifies the power of the up-converted PD signal, and outputs the power-amplified signal to the coupler 18.

The coupler 18 distributes the power-amplified signal to the antenna 19 and the down-converter 21. Thus, the signal output from the PA 17 is fed back to the distortion compensator 14A through the down-converter 21, the ADC 22, and the BPFs 23-1, 23-2. Hereinafter, a signal fed back from the PA 17 to the distortion compensator 14A is sometimes referred to as a "feedback signal."

The antenna 19 transmits the power-amplified signal by radio.

The down-converter 21 down-converts the signal input from the coupler 18, and outputs the down-converted signal to the ADC 22.

The ADC 22 converts the down-converted signal from an analog signal to a digital signal, and outputs the converted digital signal as a feedback signal to the BPFs 23-1, 23-2, the training unit 32, and the coefficient update unit 34. The feedback signal output from the ADC 22 is a digital multicarrier signal. Hereinafter, a signal output from the ADC 22 is sometimes referred to as a "feedback multicarrier signal."

The passband of the BPF 23-1 is set at a band of ±((f2−f1)/2) with the carrier frequency f1 at the center, for example. The BPF 23-1 passes only a signal at and around the carrier frequency f1 of the feedback multicarrier signal, and outputs it to the training unit 32 and the coefficient update unit 34. Hereinafter, a signal output from the BPF 23-1 is sometimes referred to as a "feedback f1 signal."

The passband of the BPF 23-2 is set at a band of ±((f2−f1)/2) with the carrier frequency f2 at the center, for example. The BPF 23-2 passes only a signal at and around the carrier frequency f2 of the feedback multicarrier signal, and outputs it to the training unit 32 and the coefficient update unit 34. Hereinafter, a signal output from the BPF 23-2 is sometimes referred to as a "feedback f2 signal."

The training unit 32 generates a "training signal" based on the feedback f1 signal, the feedback f2 signal, and the feedback multicarrier signal, and outputs the generated training signal to the error calculation unit 33. Details of the training unit 32 will be described below.

The error calculation unit 33 determines an error between the PD signal and the training signal, and outputs the determined error to the coefficient update unit 34.

The coefficient update unit 34 updates distortion compensation coefficients set in the training unit 32, using a least mean square (LMS) algorithm or the like so that the error input from the error calculation unit 33 becomes zero.

The copy unit 35 copies distortion compensation coefficients set in the training unit 32 into the PD unit 31 in a fixed cycle, specifically, each time update of distortion compensation coefficients set in the training unit 32 is performed a predetermined number of times, to update distortion compensation coefficients set in the PD unit 31.

Configuration Example of PD Unit

Figure 6:
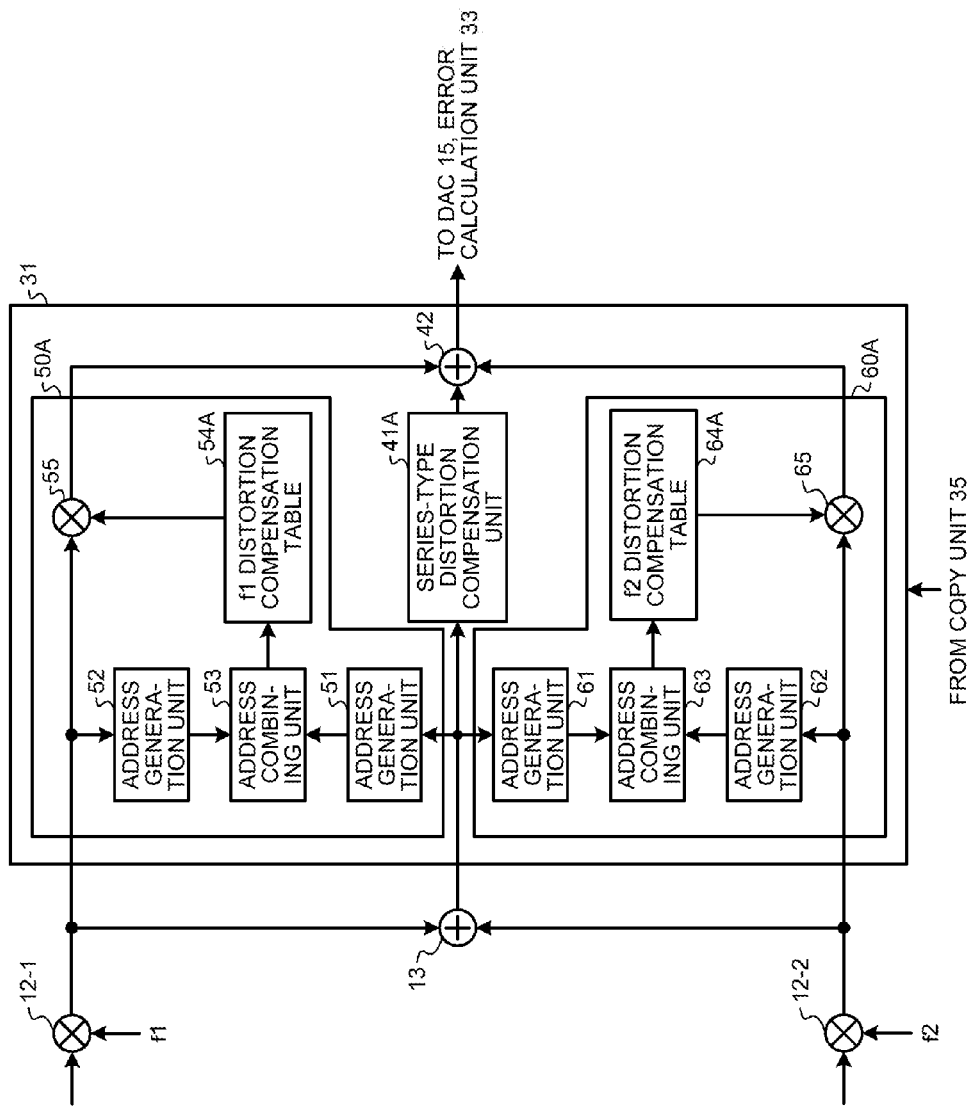
FIG. 6 is a block diagram illustrating a configuration example of a PD unit in the first embodiment.

FIG. 6 is a block diagram illustrating a configuration example of the PD unit in the first embodiment.

In FIG. 6, the PD unit 31 has LUT-type distortion compensation units 50A, 60A, a series-type distortion compensation unit 41A, and an adder 42. The LUT-type distortion compensation unit 50A has address generation units 51, 52, an address combining unit 53, an f1 distortion compensation table 54A, and a multiplier 55. The LUT-type distortion compensation unit 60A has address generation units 61, 62, an address combining unit 63, an f2 distortion compensation table 64A, and a multiplier 65.

To the series-type distortion compensation unit 41A, a multicarrier signal is input from the adder 13. The series-type distortion compensation unit 41A performs PD on the multicarrier signal, according to Expression (1), for example. The PD on the multicarrier signal corresponds to the "first distortion compensation" that sets the entire digital signal band as the distortion compensation range.

In Expression (1), $x_0(t)$ is a signal input to the series-type distortion compensation unit 41A (i.e., the multicarrier signal), $y_0(t)$ is a signal output from the series-type distortion compensation unit 41A, N is the order of a power series, and $\alpha_n$ is a distortion compensation coefficient. In order to simplify the description, the following provides a mathematical expression that does not take into consideration memory effect.

$$y_0(t) = \sum_{n=0}^{N-1} \alpha_n |x_0(t)|^n x_0(t) \quad (1)$$

Here, the magnitude of IM that occurs in contact with the carrier frequency f1 varies depending on not only the magnitude of the amplitude of the carrier signal 1 but also the magnitude of the amplitude of the carrier signal 2. Likewise, the magnitude of IM that occurs in contact with the carrier frequency f2 varies depending on not only the magnitude of the amplitude of the carrier signal 2 but also the magnitude of the amplitude of the carrier signal 1. Since the multicarrier signal is a signal into which the carrier signal 1 and the carrier signal 2 are synthesized, the amplitude of the multicarrier signal depends on the amplitude of the carrier signal 1, the amplitude of the carrier signal 2, and the phase difference between the carrier signal 1 and the carrier signal 2.

Therefore, as described below, in the LUT-type distortion compensation unit 50A, an address to be specified to the f1 distortion compensation table 54A is generated based on both of the amplitude value of the carrier signal 1 and the amplitude value of the multicarrier signal. In the LUT-type distortion compensation unit 60A, an address to be specified to the f2 distortion compensation table 64A is generated based on both of the amplitude value of the carrier signal 2 and the amplitude value of the multicarrier signal. Thus, a distortion compensation coefficient to compensate for the IM that occurs in contact with the carrier frequency f1 is generated by taking into consideration the amplitude of the carrier signal 2, the amplitude of the multicarrier signal, and the phase difference between the carrier signal 1 and the carrier signal 2. A distortion compensation coefficient to compensate for the IM that occurs in contact with the carrier frequency f2 is generated by taking into consideration the amplitude of the carrier signal 1, the amplitude of the multicarrier signal, and the phase difference between the carrier signal 1 and the carrier signal 2. Therefore, the compensation precision of the "second distortion compensation" can be further increased.

The LUT-type distortion compensation unit 50A performs PD on a signal of the carrier frequency f1 (i.e., the carrier signal 1) illustrated in FIG. 3, according to Expression (2), for example. The PD on the carrier signal 1 corresponds to distortion compensation targeted only at the left range of the distortion compensation ranges of the second distortion compensation illustrated in FIG. 3, that is, a range in the vicinity of the carrier frequency f1.

In Expression (2), $x_0(t)$ is a signal input to the address generation unit 51 (i.e., the multicarrier signal), $x_1(t)$ is a signal input to the address generation unit 52 (i.e., the carrier signal 1), $y_1(t)$ is a signal output from the multiplier 55, and $LUT_1[\ ]$ is a distortion compensation coefficient associated with the amplitude values of $x_0(t)$ and $x_1(t)$, of distortion compensation coefficients stored in the f1 distortion compensation table 54A.

$$y_1(t)=LUT_1[|x_0(t)|,|x_1(t)|]x_1(t) \qquad (2)$$

In the LUT-type distortion compensation unit 50A, the carrier signal 1 is input to the address generation unit 52 and the multiplier 55, and the multicarrier signal is input to the address generation unit 51.

The address generation unit 52 determines the amplitude value of the carrier signal 1, generates an address of "m bits" that depends on the amplitude value of the carrier signal 1, and outputs the generated m-bit address to the address combining unit 53.

The address generation unit 51 determines the amplitude value of the multicarrier signal, generates an address of "n bits" that depends on the amplitude value of the multicarrier signal, and outputs the generated n-bit address to the address combining unit 53.

The address combining unit 53 combines the m-bit address input from the address generation unit 52 and the n-bit address input from the address generation unit 51 to generate an address of "m+n bits." The address combining unit 53 specifies the m+n-bit address to the f1 distortion compensation table 54A, thereby reading a distortion compensation coefficient associated with the m+n-bit address from the f1 distortion compensation table 54A, and outputting it to the multiplier 55.

In the f1 distortion compensation table 54A, a plurality of addresses of m+n bits each, and distortion compensation coefficients associated with the plurality of addresses individually are stored. The f1 distortion compensation table 54A is a copy of an f1 training table 84A described below.

The multiplier 55 multiplies the carrier signal 1 by the distortion compensation coefficient output from the f1 distortion compensation table 54A, and outputs the multiplied signal $y_1(t)$ to the adder 42.

The LUT-type distortion compensation unit 60A performs PD on a signal of the carrier frequency f2 (i.e., the carrier signal 2) illustrated in FIG. 3, according to Expression (3), for example. The PD on the carrier signal 2 corresponds to distortion compensation targeted only at the right range of the distortion compensation ranges of the second distortion compensation illustrated in FIG. 3, that is, a range in the vicinity of the carrier frequency f2.

In Expression (3), $x_0(t)$ is a signal input to the address generation unit 61 (i.e., the multicarrier signal), $x_2(t)$ is a signal input to the address generation unit 62 (i.e., the carrier signal 2), $y_2(t)$ is a signal output from the multiplier 65, and $LUT_2[\ ]$ is a distortion compensation coefficient associated with the amplitude values of $x_0(t)$ and $x_2(t)$, of distortion compensation coefficients stored in the f2 distortion compensation table 64A.

$$y_2(t)=LUT_2[|x_0(t)|,|x_2(t)|]x_2(t) \qquad (3)$$

In the LUT-type distortion compensation unit 60A, the carrier signal 2 is input to the address generation unit 62 and the multiplier 65, and the multicarrier signal is input to the address generation unit 61.

The address generation unit 62 determines the amplitude value of the carrier signal 2, generates an address of "m bits" that depends on the amplitude value of the carrier signal 2, and outputs the generated m-bit address to the address combining unit 63.

The address generation unit 61 determines the amplitude value of the multicarrier signal, generates an address of "n bits" that depends on the amplitude value of the multicarrier signal, and outputs the generated n-bit address to the address combining unit 63.

The address combining unit 63 combines the m-bit address input from the address generation unit 62 and the n-bit address input from the address generation unit 61 to generate an address of "m+n bits." The address combining unit 63 specifies the m+n-bit address to the f2 distortion compensation table 64A, thereby reading a distortion compensation coefficient associated with the m+n-bit address from the f2 distortion compensation table 64A, and outputting it to the multiplier 65.

In the f2 distortion compensation table 64A, a plurality of addresses of m+n bits each, and distortion compensation coefficients associated with the plurality of addresses individually are stored. The f2 distortion compensation table 64A is a copy of an f2 training table 94A described below.

The multiplier 65 multiplies the carrier signal 2 by the distortion compensation coefficient output from the f2 distortion compensation table 64A, and outputs the multiplied signal $y_2(t)$ to the adder 42.

The adder 42 adds and synthesizes the signal $y_0(t)$ output from the series-type distortion compensation unit 41A, the signal $y_1(t)$ output from the multiplier 55, and the signal $y_2(t)$ output from the multiplier 65, thereby generating a PD signal y(t), and outputs the generated PD signal y(t) to the DAC 15 and the error calculation unit 33.

Configuration Example of Training Unit

Figure 7:
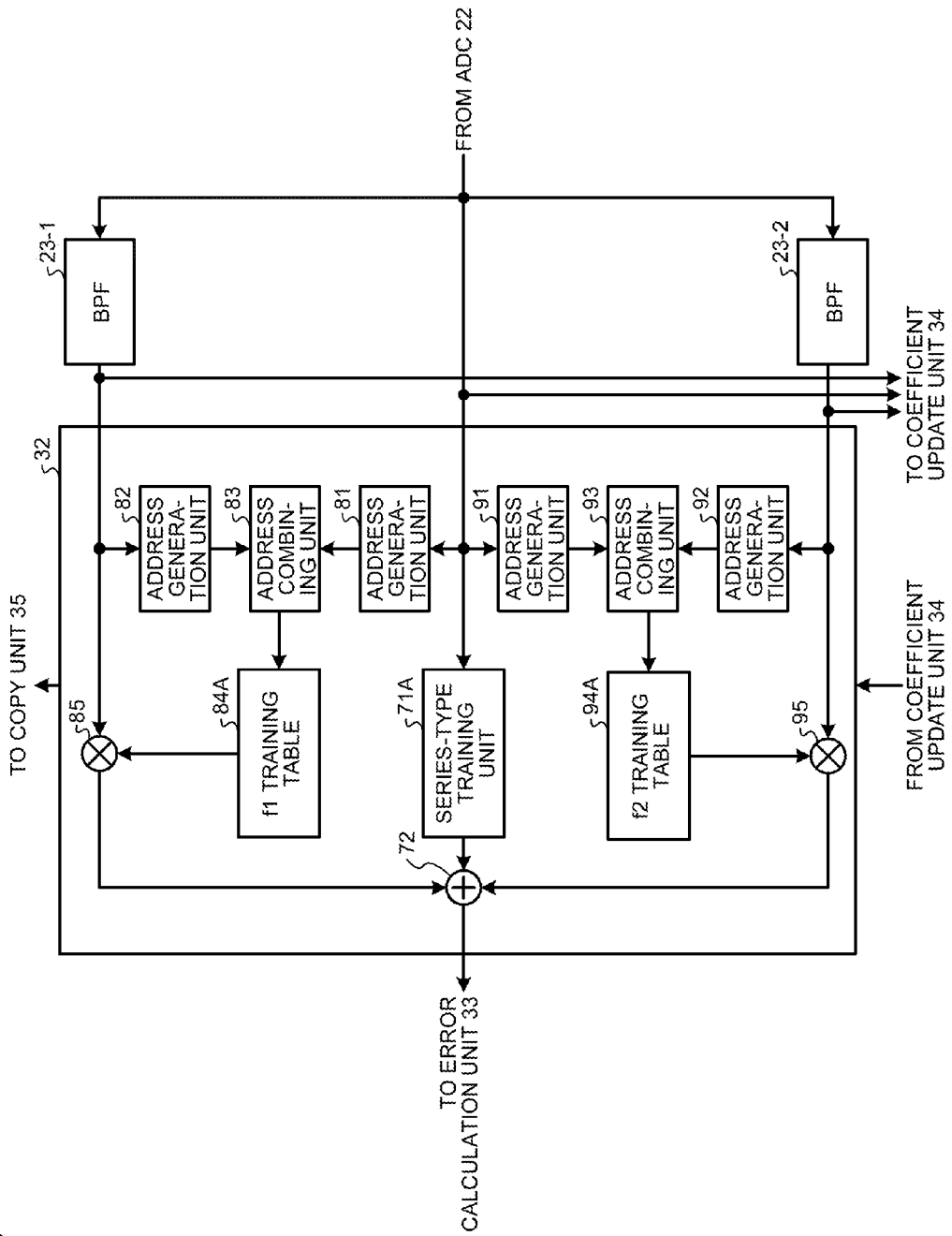
FIG. 7 is a block diagram illustrating a configuration example of a training unit in the first embodiment.

FIG. 7 is a block diagram illustrating a configuration example of a training unit in the first embodiment.

In FIG. 7, the training unit 32 has address generation units 81, 82, 91, 92, address combining units 83, 93, the f1 training table 84A, the f2 training table 94A, multipliers 85, 95, a series-type training unit 71A, and an adder 72.

To the series-type training unit 71A, a feedback multicarrier signal is input from the ADC 22. The series-type training unit 71A performs training of PD on the multicarrier signal, according to Expression (4), for example. In Expression (4), $x_0'(t)$ is a signal input to the series-type training unit 71A (i.e., the feedback multicarrier signal), $y_0'(t)$ is a signal output from the series-type training unit 71A, N is the order of a power series, and $\alpha_n'$ is a distortion compensation coefficient.

$$y_0'(t) = \sum_{n=0}^{N-1} \alpha_n' |x_0'(t)|^n x_0'(t) \quad (4)$$

The feedback f1 signal is input to the address generation unit 82 and the multiplier 85, and the feedback multicarrier signal is input to the address generation unit 81.

The address generation unit 82 determines the amplitude value of the feedback f1 signal, generates an address of "m bits" that depends on the amplitude value of the feedback f1 signal, and outputs the generated m-bit address to the address combining unit 83.

The address generation unit 81 determines the amplitude value of the feedback multicarrier signal, generates an address of "n bits" that depends on the amplitude value of the feedback multicarrier signal, and outputs the generated n-bit address to the address combining unit 83.

The address combining unit 83 combines the m-bit address input from the address generation unit 82 and the n-bit address input from the address generation unit 81 to generate an address of "m+n bits." The address combining unit 83 specifies the m+n-bit address to the f1 training table 84A, thereby reading a distortion compensation coefficient associated with the m+n-bit address from the f1 training table 84A, and outputting it to the multiplier 85.

In the f1 training table 84A, a plurality of addresses of m+n bits each, and distortion compensation coefficients associated with the plurality of addresses individually are stored.

The multiplier 85 multiplies the feedback f1 signal by the distortion compensation coefficient output from the f1 training table 84A, and outputs the multiplied signal $y_1'(t)$ to the adder 72. Thus, the signal $y_1'(t)$ output from the multiplier 85 is expressed by Expression (5). In Expression (5), $x_0'(t)$ is a signal input to the address generation unit 81 (i.e., the feedback multicarrier signal), $x_1'(t)$ is a signal input to the address generation unit 82 (i.e., the feedback f1 signal), and $LUT_1'[\ ]$ is a distortion compensation coefficient associated with the amplitude values of $x_0'(t)$ and $x_1'(t)$, of distortion compensation coefficients stored in the f1 training table 84A.

$$y_1'(t) = LUT_1'[|x_0'(t)|, |x_1'(t)|] x_1'(t) \quad (5)$$

The feedback f2 signal is input to the address generation unit 92 and the multiplier 95, and the feedback multicarrier signal is input to the address generation unit 91.

The address generation unit 92 determines the amplitude value of the feedback f2 signal, generates an address of "m bits" that depends on the amplitude value of the feedback f2 signal, and outputs the generated m-bit address to the address combining unit 93.

The address generation unit 91 determines the amplitude value of the feedback multicarrier signal, generates an address of "n bits" that depends on the amplitude value of the feedback multicarrier signal, and outputs the generated n-bit address to the address combining unit 93.

The address combining unit 93 combines the m-bit address input from the address generation unit 92 and the n-bit address input from the address generation unit 91 to generate an address of "m+n bits." The address combining unit 93 specifies the m+n-bit address to the f2 training table 94A, thereby reading a distortion compensation coefficient associated with the m+n-bit address from the f2 training table 94A, and outputting it to the multiplier 95.

In the f2 training table 94A, a plurality of addresses of m+n bits each, and distortion compensation coefficients associated with the plurality of addresses individually are stored.

The multiplier 95 multiplies the feedback f2 signal by the distortion compensation coefficient output from the f2 training table 94A, and outputs the multiplied signal $y_2'(t)$ to the adder 72. Thus, the signal $y_2'(t)$ output from the multiplier 95 is expressed by Expression (6). In Expression (6), $x_0'(t)$ is a signal input to the address generation unit 91 (i.e., the feedback multicarrier signal), $x_2'(t)$ is a signal input to the address generation unit 92 (i.e., the feedback f2 signal), and $LUT_2'[\ ]$ is a distortion compensation coefficient associated with the amplitude values of $x_0'(t)$ and $x_2'(t)$, of distortion compensation coefficients stored in the f2 training table 94A.

$$y_2'(t) = LUT_2'[|x_0'(t)|, |x_2'(t)|] x_2'(t) \quad (6)$$

The adder 72 adds and synthesizes the signal $y_0'(t)$ output from the series-type training unit 71A, the signal $y_1'(t)$ output from the multiplier 85, and the signal $y_2'(t)$ output from the multiplier 95, thereby generating a training signal $y'(t)$, and outputs the generated training signal $y'(t)$ to the error calculation unit 33.

The error calculation unit 33 illustrated in FIG. 5 determines an error between the PD signal y(t) and the training signal y'(t), and outputs the determined error to the coefficient update unit 34. For example, the error calculation unit 33 determines the error by subtracting the training signal y'(t) from the PD signal y(t).

The coefficient update unit 34 determines new distortion compensation coefficients $\alpha_n'$, $LUT_1'[\ ]$, and $LUT_2'[\ ]$ that make the error $\epsilon$ input from the error calculation unit 33 zero, based on the feedback multicarrier signal, the feedback f1 signal, the feedback f2 signal, and distortion compensation coefficients determined last time, using the LMS algorithm or the like. Then, the coefficient update unit 34 updates the distortion compensation coefficient $\alpha_n'$ in the series-type training unit 71A, the distortion compensation coefficient $LUT_1'[\ ]$ in the f1 training table 84A, and the distortion compensation coefficient $LUT_2'[\ ]$ in the f2 training table 94A, using the newly determined distortion compensation coefficients.

The copy unit 35 copies distortion compensation coefficients $\alpha_n'$ set in the series-type training unit 71A onto distortion compensation coefficients $\alpha_n$ set in the series-type distortion compensation unit 41A to update the distortion compensation coefficients $\alpha_n$ in the fixed cycle. The copy unit 35 also copies the f1 training table 84A onto the f1 distortion compensation table 54A to update the f1 distortion compensation table 54A in the fixed cycle. The copy unit 35 also copies the f2 training table 94A onto the f2 distortion compensation table 64A to update the f2 distortion compensation table 64A in the fixed cycle.

As described above, the distortion compensator 14A in the first embodiment compensates for nonlinear distortion of the PA 17 that amplifies the power of a multicarrier signal. The distortion compensator 14A has the series-type distortion compensation unit 41A and the LUT-type distortion compensation units 50A, 60A. The series-type distortion compensation unit 41A performs the first distortion compensation to compensate for the first IM and the second IM collectively. On the other hand, the LUT-type distortion compensation units 50A, 60A perform the second distortion compensation to compensate for only the first IM, of the first IM and the second IM.

This can improve the distortion compensation performance in the vicinities of carrier frequencies, and can sufficiently suppress the first IM. Thus, according to the first embodiment, the ACLR can be improved. Further, it is possible to perform the first distortion compensation, and on the other hand, to perform the second distortion compensation with a high degree of precision, with a limited increase in the circuit size, and with the convergence speed of distortion compensation coefficients prevented from becoming excessively low.

In the first embodiment, the LUT-type distortion compensation unit 50A performs the second distortion compensation based on both of the amplitude value of the carrier signal 1 and the amplitude value of the multicarrier signal. Likewise, the LUT-type distortion compensation unit 60A performs the second distortion compensation based on both of the amplitude value of the carrier signal 2 and the amplitude value of the multicarrier signal.

This can further increase the compensation precision of the second distortion compensation.

[b] Second Embodiment

Configuration Example of Wireless Transmission Device

Figure 8:
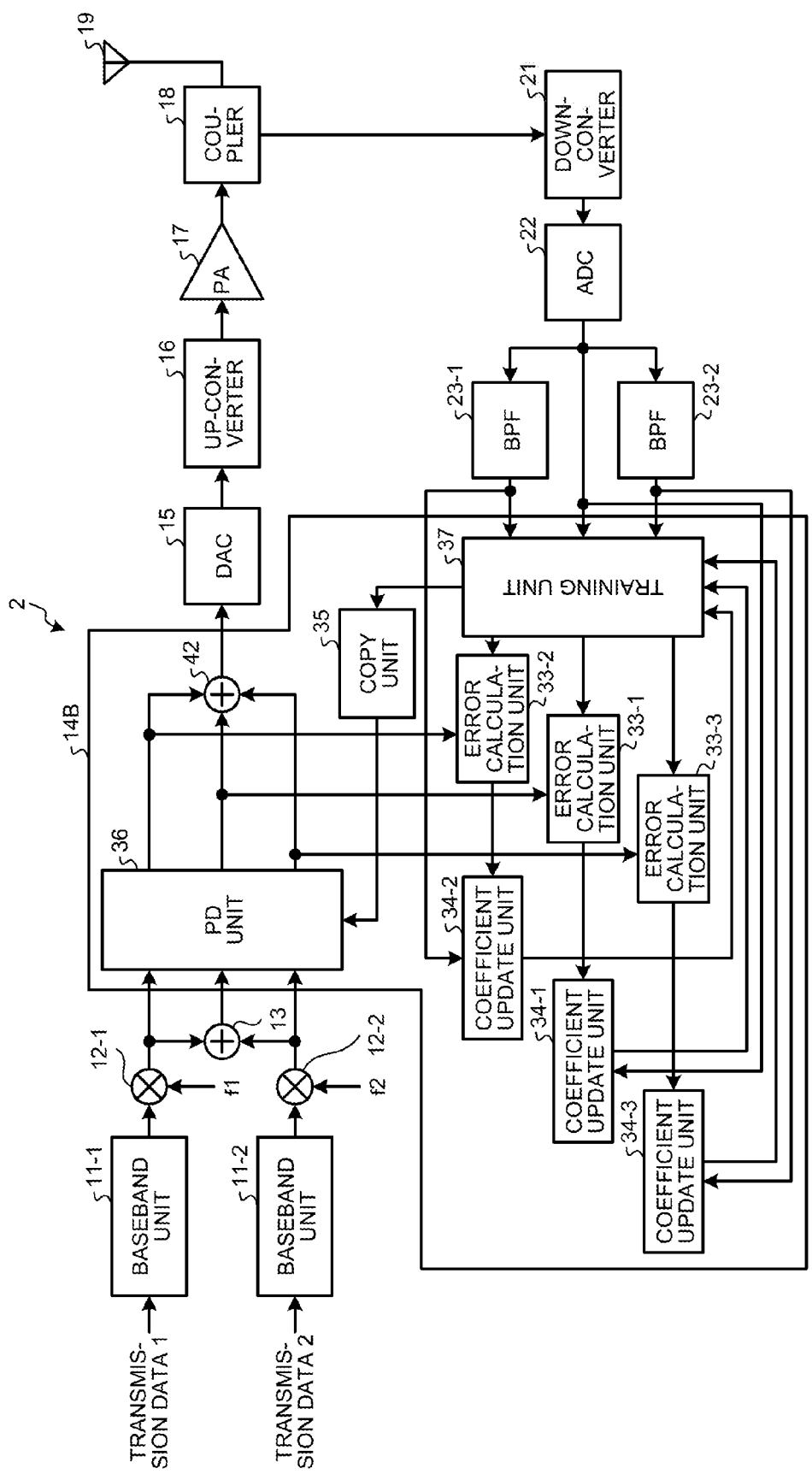
FIG. 8 is a block diagram illustrating a configuration example of a wireless transmission device in a second embodiment.

FIG. 8 is a block diagram illustrating a configuration example of a wireless transmission device in a second embodiment. In FIG. 8, a wireless transmission device 2 has a distortion compensator 14B. The distortion compensator 14B has a PD unit 36, a training unit 37, error calculation units 33-1, 33-2, 33-3, and coefficient update units 34-1, 34-2, 34-3. An ADC 22 outputs a feedback multicarrier signal to BPFs 23-1, 23-2, the training unit 37, and the coefficient update unit 34-1. The BPF 23-1 outputs a feedback f1 signal to the training unit 37 and the coefficient update unit 34-2. The BPF 23-2 outputs a feedback f2 signal to the training unit 37 and the coefficient update unit 34-3.

Configuration Example of PD Unit

Figure 9:
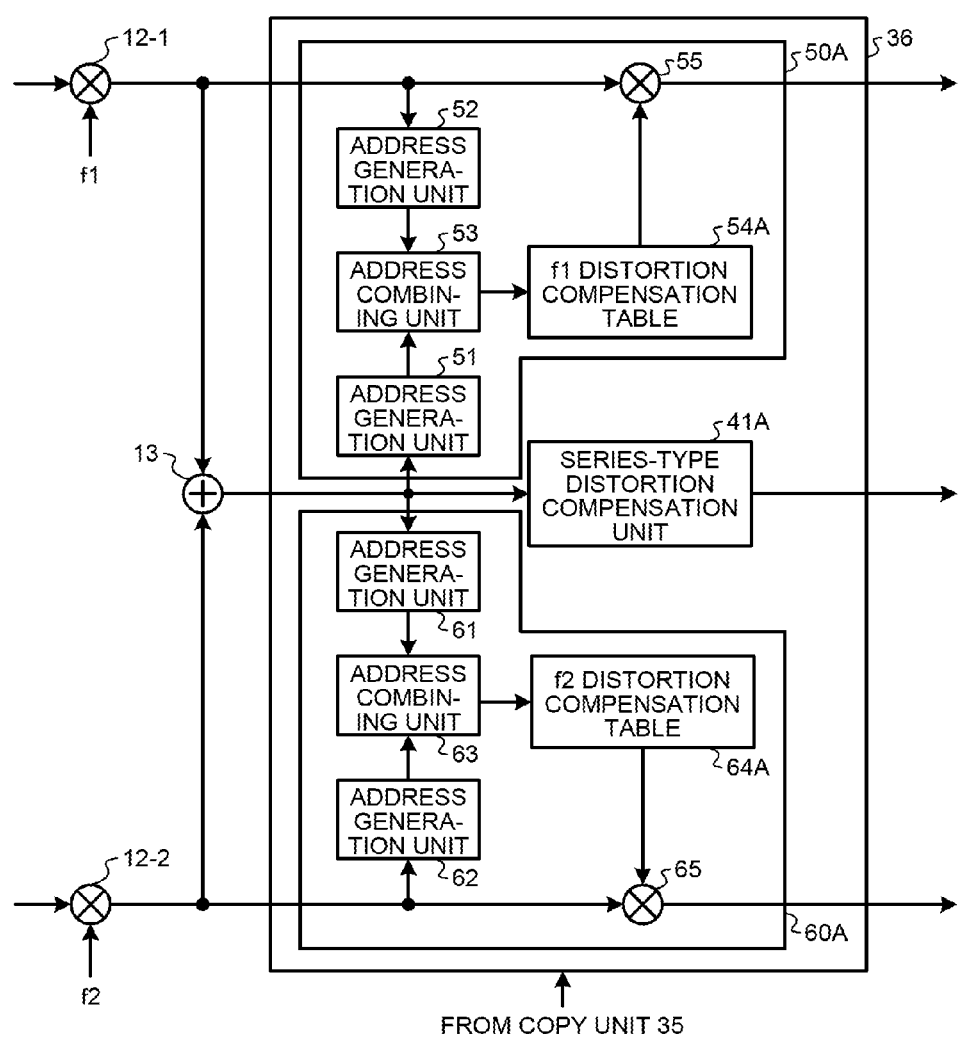
FIG. 9 is a block diagram illustrating a configuration example of a PD unit in the second embodiment.

FIG. 9 is a block diagram illustrating a configuration example of a PD unit in the second embodiment. The PD unit 36 illustrated in FIG. 9 is the PD unit 31 illustrated in FIG. 6 from which the adder 42 is removed. In the distortion compensator 14B, an adder 42 is provided outside the PD unit 36 as illustrated in FIG. 8.

Configuration Example of Training Unit

Figure 10:
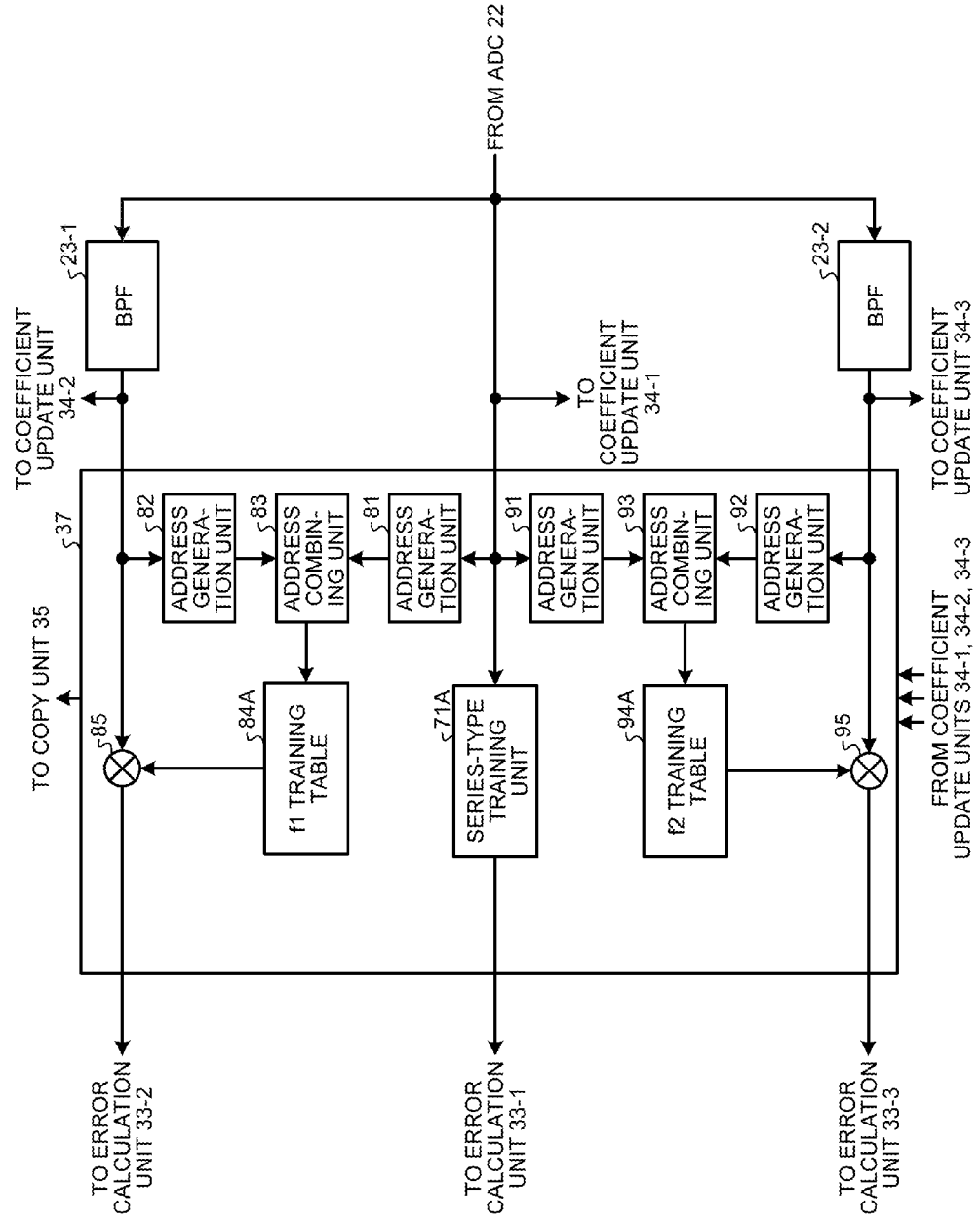
FIG. 10 is a block diagram illustrating a configuration example of a training unit in the second embodiment.

FIG. 10 is a block diagram illustrating a configuration example of a training unit in the second embodiment. The training unit 37 illustrated in FIG. 10 is the training unit 32 illustrated in FIG. 7 from which the adder 72 is removed.

In the distortion compensator 14B adopting the above configuration, a multiplier 55 multiplies a carrier signal 1 by a distortion compensation coefficient output from an f1 distortion compensation table 54A, and outputs the multiplied signal $y_1(t)$ to the adder 42 and the error calculation unit 33-2. The multiplier 65 multiplies a carrier signal 2 by a distortion compensation coefficient output from an f2 distortion compensation table 64A, and outputs the multiplied signal $y_2(t)$ to the adder 42 and the error calculation unit 33-3. A series-type distortion compensation unit 41A outputs a signal $y_0(t)$ to the adder 42 and the error calculation unit 33-1.

A multiplier 85 multiplies a feedback f1 signal by a distortion compensation coefficient output from an f1 training table 84A, and outputs the multiplied signal $y_1'(t)$ to the error calculation unit 33-2. A multiplier 95 multiplies a feedback f2 signal 2 by a distortion compensation coefficient output from an f2 training table 94A, and outputs the multiplied signal $y_2'(t)$ to the error calculation unit 33-3. A series-type training unit 71A outputs a signal $y_0'(t)$ to the error calculation unit 33-1.

The error calculation unit 33-2 determines an error $\epsilon_1$ between the signal $y_1(t)$ and the signal $y_1'(t)$, and outputs the determined error $\epsilon_1$ to the coefficient update unit 34-2. For example, the error calculation unit 33-2 determines the error $\epsilon_1$ by subtracting the signal $y_1'(t)$ from the signal $y_1(t)$. The error calculation unit 33-3 determines an error $\epsilon_2$ between the signal $y_2(t)$ and the signal $y_2'(t)$, and outputs the determined error $\epsilon_2$ to the coefficient update unit 34-3. For example, the error calculation unit 33-3 determines the error $\epsilon_2$ by subtracting the signal $y_2'(t)$ from the signal $y_2(t)$. The error calculation unit 33-1 determines an error $\epsilon_0$ between the signal $y_0(t)$ and the signal $y_0'(t)$, and outputs the determined error $\epsilon_0$ to the coefficient update unit 34-1. For example, the error calculation unit 33-1 determines the error $\epsilon_0$ by subtracting the signal $y_0'(t)$ from the signal $y_0(t)$.

The coefficient update unit 34-2 determines a new distortion compensation coefficient $LUT_1'[\ ]$ that makes the error $\epsilon_1$ zero, based on the feedback f1 signal and a distortion compensation coefficient determined last time, using an LMS algorithm or the like. Then, the coefficient update unit 34-2 updates a distortion compensation coefficient $LUT_1'[\ ]$ in the f1 training table 84A, using the newly determined $LUT_1'[\ ]$. The coefficient update unit 34-3 determines a new distortion compensation coefficient $LUT_2'[\ ]$ that makes the error $\epsilon_2$ zero, based on the feedback f2 signal and a distortion compensation coefficient determined last time, using the LMS algorithm or the like. Then, the coefficient update unit 34-3 updates a distortion compensation coefficient $LUT_2'[\ ]$ in the f2 training table 94A, using the newly determined $LUT_2'[\ ]$. The coefficient update unit 34-1 determines a distortion compensation coefficient $\alpha_n'$ that makes the error $\epsilon_0$ zero, based on the feedback multicarrier signal and a distortion compensation coefficient determined last time, using the LMS algorithm or the like. Then, the coefficient update unit 34-1 updates a distortion compensation coefficient $\alpha_n'$ in the series-type training unit 71A, using the newly determined $\alpha_n'$.

Thus, in the second embodiment, the coefficient update unit 34-1 updates the distortion compensation coefficient $\alpha_n'$ based on the multicarrier signal. On the other hand, the coefficient update unit 34-2 updates the distortion compensation coefficient $LUT_1'[\ ]$ based on the carrier signal 1, and the coefficient update unit 34-3 updates the distortion compensation coefficient $LUT_2'[\ ]$ based on the carrier signal 2. That is, in the first embodiment, the distortion compensation coefficients $\alpha_n'$ $LUT_1'[\ ]$, and $LUT_2'[\ ]$ are updated collectively based on the multicarrier signal, while in the second embodiment, the distortion compensation coefficients $\alpha_n'$ $LUT_1'[\ ]$, and $LUT_2'[\ ]$ are updated individually based on the multicarrier signal, the carrier signal 1, and the carrier signal 2, respectively. Thus, according to the second embodiment, the precision of distortion compensation coefficients can be increased.

[c] Third Embodiment

A third embodiment is different from the second embodiment in the configuration of a PD unit and in the configuration of a training unit.

Configuration Example of PD Unit

Figure 11:
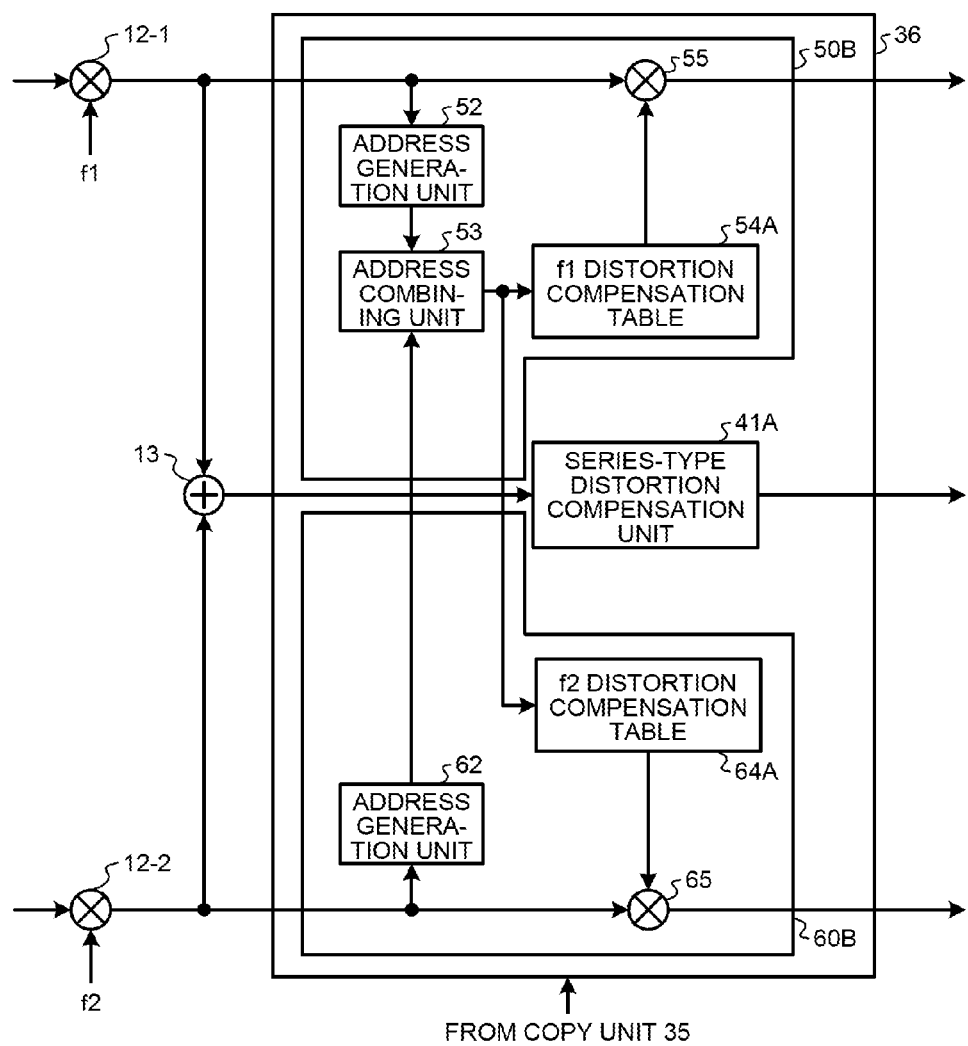
FIG. 11 is a block diagram illustrating a configuration example of a PD unit in a third embodiment.

FIG. 11 is a block diagram illustrating a configuration example of a PD unit in the third embodiment. A PD unit 36 illustrated in FIG. 11 has LUT-type distortion compensation units 50B, 60B, and is the PD unit 36 illustrated in FIG. 9 from which the address generation units 51, 61 and the address combining unit 63 are removed.

An address generation unit 52 determines the amplitude value of a carrier signal 1, generates an address of "m bits"

that depends on the amplitude value of the carrier signal 1, and outputs the generated m-bit address to an address combining unit 53.

An address generation unit 62 determines the amplitude value of a carrier signal 2, generates an address of "n bits" that depends on the amplitude value of the carrier signal 2, and outputs the generated n-bit address to the address combining unit 53.

The address combining unit 53 combines the m-bit address input from the address generation unit 52 and the n-bit address input from the address generation unit 62 to generate an address of "m+n bits." The address combining unit 53 specifies the m+n-bit address to an f1 distortion compensation table 54A, thereby reading a distortion compensation coefficient associated with the m+n-bit address from the f1 distortion compensation table 54A, and outputting it to a multiplier 55. The address combining unit 53 also specifies the m+n-bit address to an f2 distortion compensation table 64A, thereby reading a distortion compensation coefficient associated with the m+n-bit address from the f2 distortion compensation table 64A, and outputting it to a multiplier 65.

Configuration Example of Training Unit

Figure 12:
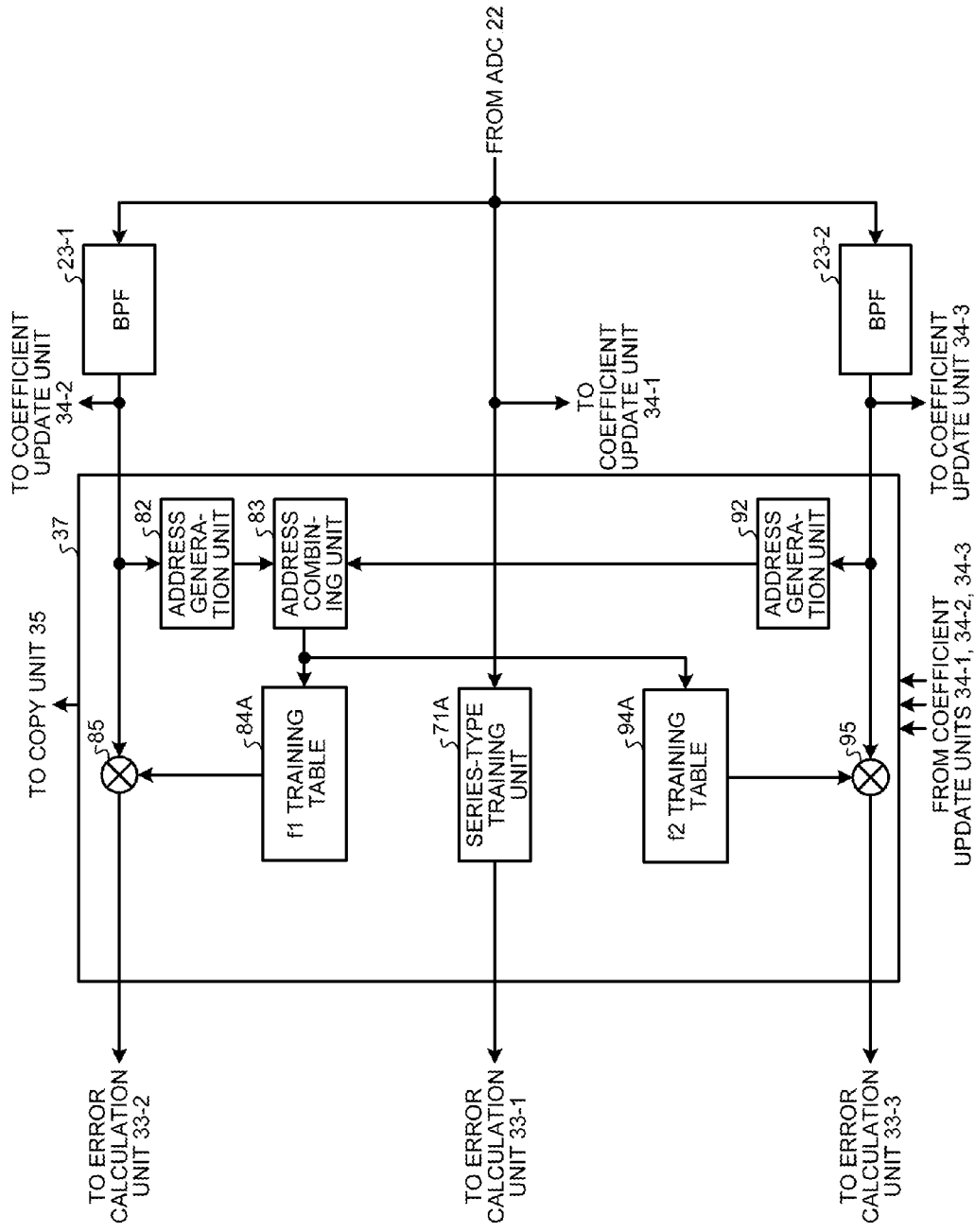
FIG. 12 is a block diagram illustrating a configuration example of a training unit in the third embodiment.

FIG. 12 is a block diagram illustrating a configuration example of a training unit in the third embodiment. A training unit 37 illustrated in FIG. 12 is the training unit 37 illustrated in FIG. 10 from which the address generation units 81, 91 and the address combining unit 93 are removed.

An address generation unit 82 determines the amplitude value of a feedback f1 signal, generates an address of "m bits" that depends on the amplitude value of the feedback f1 signal, and outputs the generated m-bit address to an address combining unit 83.

An address generation unit 92 determines the amplitude value of a feedback f2 signal, generates an address of "n bits" that depends on the amplitude value of the feedback f2 signal, and outputs the generated n-bit address to the address combining unit 83.

The address combining unit 83 combines the m-bit address input from the address generation unit 82 and the n-bit address input from the address generation unit 92 to generate an address of "m+n bits." The address combining unit 83 specifies the m+n-bit address to an f1 training table 84A, thereby reading a distortion compensation coefficient associated with the m+n-bit address from the f1 training table 84A, and outputting it to a multiplier 85. The address combining unit 83 also specifies the m+n-bit address to an f2 training table 94A, thereby reading a distortion compensation coefficient associated with the m+n-bit address from the f2 training table 94A, and outputting it to a multiplier 95.

As above, in the third embodiment, the LUT-type distortion compensation units 50B, 60B perform second distortion compensation based on the respective amplitude values of the carrier signal 1 and the carrier signal 2.

This allows the distortion compensator in the third embodiment to omit the address generation units 51, 61 and the address combining unit 63 in the second embodiment, and thus to reduce the circuit size of the distortion compensator, compared to the second embodiment.

[d] Fourth Embodiment

A fourth embodiment is different from the first embodiment in the configuration of a PD unit and in the configuration of a training unit.

Configuration Example of PD Unit

Figure 13:
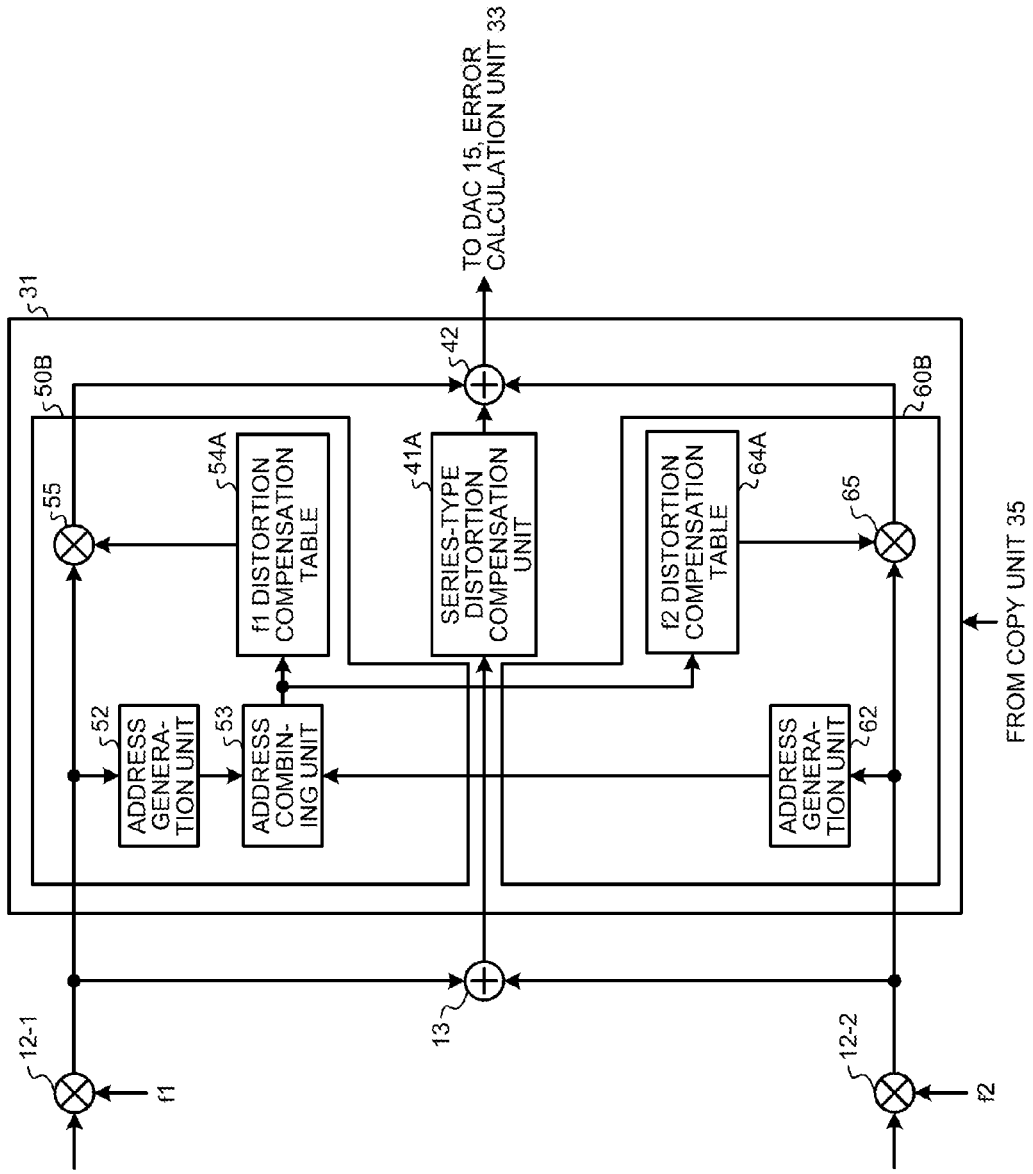
FIG. 13 is a block diagram illustrating a configuration example of a PD unit in a fourth embodiment.

FIG. 13 is a block diagram illustrating a configuration example of a PD unit in the fourth embodiment. A PD unit 31 illustrated in FIG. 13 has LUT-type distortion compensation units 50B, 60B, and is the PD unit 31 illustrated in FIG. 6 from which the address generation units 51, 61 and the address combining unit 63 are removed.

An address generation unit 52 determines the amplitude value of a carrier signal 1, generates an address of "m bits" that depends on the amplitude value of the carrier signal 1, and outputs the generated m-bit address to an address combining unit 53.

An address generation unit 62 determines the amplitude value of a carrier signal 2, generates an address of "n bits" that depends on the amplitude value of the carrier signal 2, and outputs the generated n-bit address to the address combining unit 53.

The address combining unit 53 combines the m-bit address input from the address generation unit 52 and the n-bit address input from the address generation unit 62 to generate an address of "m+n bits." The address combining unit 53 specifies the m+n-bit address to an f1 distortion compensation table 54A, thereby reading a distortion compensation coefficient associated with the m+n-bit address from the f1 distortion compensation table 54A, and outputting it to a multiplier 55. The address combining unit 53 also specifies the m+n-bit address to an f2 distortion compensation table 64A, thereby reading a distortion compensation coefficient associated with the m+n-bit address from the f2 distortion compensation table 64A, and outputting it to a multiplier 65.

Configuration Example of Training Unit

Figure 14:
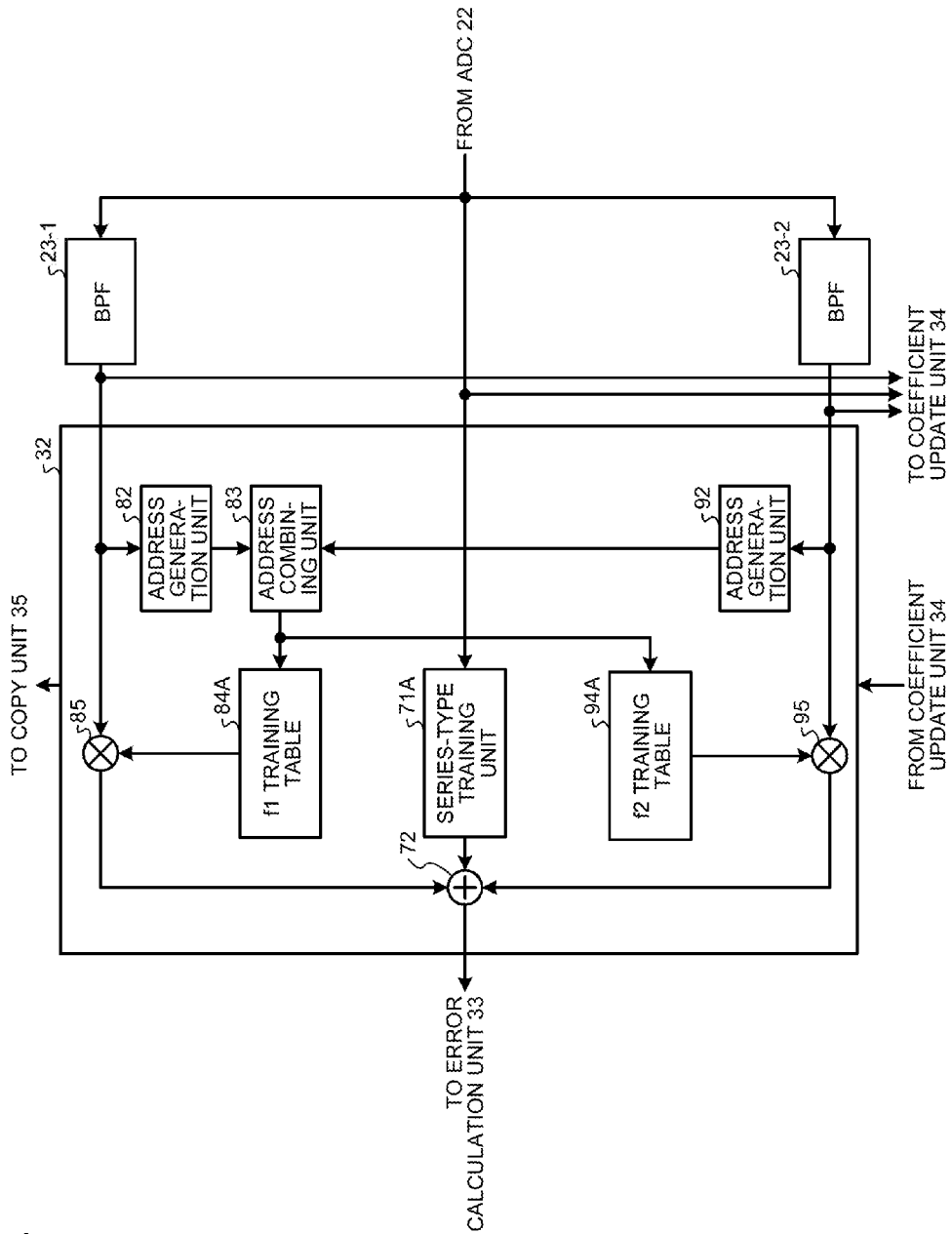
FIG. 14 is a block diagram illustrating a configuration example of a training unit in the fourth embodiment.

FIG. 14 is a block diagram illustrating a configuration example of a training unit in the fourth embodiment. A training unit 32 illustrated in FIG. 14 is the training unit 32 illustrated in FIG. 7 from which the address generation units 81, 91 and the address combining unit 93 are removed.

An address generation unit 82 determines the amplitude value of a feedback f1 signal, generates an address of "m bits" that depends on the amplitude value of the feedback f1 signal, and outputs the generated m-bit address to an address combining unit 83.

An address generation unit 92 determines the amplitude value of a feedback f2 signal, generates an address of "n bits" that depends on the amplitude value of the feedback f2 signal, and outputs the generated n-bit address to the address combining unit 83.

The address combining unit 83 combines the m-bit address input from the address generation unit 82 and the n-bit address input from the address generation unit 92 to generate an address of "m+n bits." The address combining unit 83 specifies the m+n-bit address to an f1 training table 84A, thereby reading a distortion compensation coefficient associated with the m+n-bit address from the f1 training table 84A, and outputting it to a multiplier 85. The address combining unit 83 also specifies the m+n-bit address to an f2 training table 94A, thereby reading a distortion compensation coefficient associated with the m+n-bit address from the f2 training table 94A, and outputting it to a multiplier 95.

As above, in the fourth embodiment, the LUT-type distortion compensation units 50B, 60B perform second distortion compensation based on the respective amplitude values of the carrier signal 1 and the carrier signal 2.

This allows the distortion compensator in the fourth embodiment to omit the address generation units 51, 61 and the address combining unit 63 in the first embodiment, and thus to reduce the circuit size of the distortion compensator, compared to the first embodiment.

[e] Fifth Embodiment

In the first embodiment, the distortion compensation coefficient $\alpha_n'$ used in the first distortion compensation and the distortion compensation coefficients $LUT_1'[\ ]$, $LUT_2'[\ ]$ used in the second distortion compensation are updated simultaneously. However, as illustrated in FIG. 3, the distortion compensation ranges of the second distortion compensation cover part of the distortion compensation range of the first distortion compensation. Thus, update of the distortion compensation coefficient $\alpha_n'$ changes the distortion compensation coefficients $LUT_1'[\ ]$, $LUT_2'[\ ]$ that make an error $\epsilon$ zero, and update of the distortion compensation coefficients $LUT_1'[\ ]$, $LUT_2'[\ ]$ changes the distortion compensation coefficient $\alpha_n'$ that makes an error $\epsilon$ zero. Therefore, when the distortion compensation coefficient $\alpha_n'$ and the distortion compensation coefficients $LUT_1'[\ ]$, $LUT_2'[\ ]$ are updated simultaneously, convergence of distortion compensation coefficients can be unstable, and thus the distortion compensation coefficients $\alpha_n'$, $LUT_1'[\ ]$, and $LUT_2'[\ ]$ that make an error $\epsilon$ zero are not necessarily determined.

Figure 15:
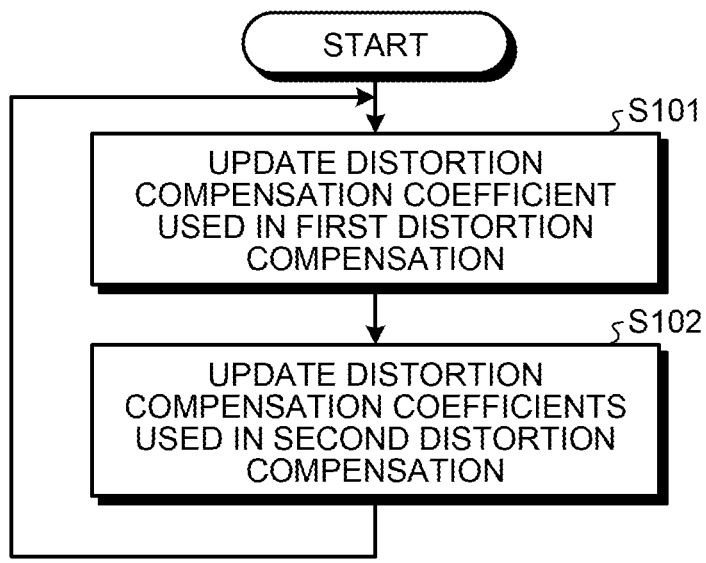
FIG. 15 is a flowchart for explaining a processing example of a distortion compensator in a fifth embodiment.

Therefore, in the fifth embodiment, as illustrated in FIG. 15, a distortion compensation coefficient used in the first distortion compensation and distortion compensation coefficients used in the second distortion compensation are updated at different timings. FIG. 15 is a flowchart for explaining a processing example of a distortion compensator in the fifth embodiment. Specifically, a coefficient update unit 34 (FIG. 5) first updates a distortion compensation coefficient used in the first distortion compensation (i.e., the distortion compensation coefficient $\alpha_n'$) (step S101). After the update of the distortion compensation coefficient used in the first distortion compensation, the coefficient update unit 34 updates distortion compensation coefficients used in the second distortion compensation (i.e., the distortion compensation coefficients $LUT_1'[\ ]$, $LUT_2'[\ ]$) (step S102). After the update of the distortion compensation coefficients used in the second distortion compensation, the processing returns to step S101, and processing in steps S101, S102 is repeated in a fixed cycle. That is, the coefficient update unit 34 performs update of a distortion compensation coefficient used in the first distortion compensation and update of distortion compensation coefficients used in the second distortion compensation alternately.

By thus exclusively performing update of a distortion compensation coefficient used in the first distortion compensation and update of distortion compensation coefficients used in the second distortion compensation, which affect each other, the convergence of distortion compensation coefficients is increased in stability, and the precision of the distortion compensation coefficients can be increased.

[f] Other Embodiments

[1] In the above-described embodiments, the series-type distortion compensation is used as the first distortion compensation, and the LUT-type distortion compensation is used as the second distortion compensation. However, in order to further increase the convergence speed of distortion compensation coefficients, the series-type distortion compensation may be used for both of the first distortion compensation and the second distortion compensation. Alternatively, in order to perform higher-precision distortion compensation, the LUT-type distortion compensation may be used for both of the first distortion compensation and the second distortion compensation.

[2] When the amplitude value of an error determined by the error calculation unit 33 is less than a threshold (e.g. −45 dB) with respect to the mean amplitude value of a multicarrier signal input to the series-type distortion compensation unit 41A, update of distortion compensation coefficients may be stopped. When the ACLR is less than a threshold (e.g. −45 dBc), update of distortion compensation coefficients may be stopped.

[3] The fifth embodiment may be performed in combination with the fourth embodiment. The fifth embodiment may also be performed in combination with the second embodiment or the third embodiment. For example, update of a distortion compensation coefficient performed by the coefficient update unit 34-1 and update of distortion compensation coefficients performed by the coefficient update units 34-2, 34-3 may be performed at different timings.

[4] In the above-described embodiments, indirect-learning-system distortion compensators have been taken as an example. However, the disclosed technology is also applicable to direct-learning-system distortion compensators.

[5] The distortion compensators 14A, 14B are realized as hardware by a field-programmable gate array (FPGA), a large-scale integrated circuit (LSI), a processor, or the like, for example. The baseband units 11-1, 11-2, the multipliers 12-1, 12-2, the adder 13, and the BPFs 23-1, 23-2 are also realized as hardware by an FPGA, an LSI, a processor, or the like. Examples of the processor include a central processing unit (CPU), a digital signal processor (DSP), and so on. The DAC 15, the up-converter 16, the PA 17, the coupler 18, the antenna 19, the down-converter 21, and the ADC 22 are realized as hardware by a wireless communication module. The wireless transmission devices 1, 2 and the distortion compensators 14A, 14B may have memory. For example, in the memory, the f1 distortion compensation table 54A, the f2 distortion compensation table 64A, the f1 training table 84A, and the f2 training table 94A are stored.

According to the disclosed aspect, distortion compensation performance in the vicinities of carrier frequencies can be improved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensator that compensates for nonlinear distortion of an amplifier that amplifies power of a multicarrier signal, the distortion compensator comprising:
    a first compensation unit that performs first distortion compensation to collectively compensate for first nonlinear distortion that occurs in contact with a carrier frequency of the multicarrier signal, and second nonlinear distortion that occurs at a frequency at a predetermined distance from the carrier frequency; and
    a second compensation unit that performs second distortion compensation to compensate for only the first nonlinear distortion, of the first nonlinear distortion and the second nonlinear distortion.

2. The distortion compensator according to claim 1, wherein
    the first compensation unit performs the first distortion compensation using a power series, and
    the second compensation unit performs the second distortion compensation using a table in which a distortion compensation coefficient is stored.

3. The distortion compensator according to claim 1, wherein the second compensation unit performs the second distortion compensation based on both an amplitude value of a signal of the carrier frequency and an amplitude value of the multicarrier signal.

4. The distortion compensator according to claim 1, further comprising an update unit that performs update of a first distortion compensation coefficient used in the first distortion compensation and update of a second distortion compensation coefficient used in the second distortion compensation at different timings.

5. The distortion compensator according to claim 1, further comprising:
  a first update unit that updates a first distortion compensation coefficient used in the first distortion compensation based on the multicarrier signal; and
  a second update unit that updates a second distortion compensation coefficient used in the second distortion compensation based on a signal of the carrier frequency.

6. The distortion compensator according to claim 5, wherein the first update unit and the second update unit update the first distortion compensation coefficient or the second distortion compensation coefficient at different timings.

7. The distortion compensator according to claim 5, wherein the second compensation unit performs the second distortion compensation based on each of amplitude values of signals of the plurality of carrier frequencies.

8. A distortion compensation method for compensating for nonlinear distortion of an amplifier that amplifies power of a multicarrier signal, the distortion compensation method comprising:
  performing first distortion compensation to collectively compensate for first nonlinear distortion that occurs in contact with a carrier frequency of the multicarrier signal, and second nonlinear distortion that occurs at a frequency at a predetermined distance from the carrier frequency; and
  performing second distortion compensation to compensate for only the first nonlinear distortion, of the first nonlinear distortion and the second nonlinear distortion.

* * * * *